United States Patent
Johnson

(10) Patent No.: US 7,030,045 B2
(45) Date of Patent: Apr. 18, 2006

(54) METHOD OF FABRICATING OXIDES WITH LOW DEFECT DENSITIES

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 10/415,731

(22) PCT Filed: Nov. 7, 2001

(86) PCT No.: PCT/US01/51502

§ 371 (c)(1),
(2), (4) Date: May 2, 2003

(87) PCT Pub. No.: WO02/075801

PCT Pub. Date: Sep. 26, 2002

(65) Prior Publication Data

US 2004/0214451 A1    Oct. 28, 2004

Related U.S. Application Data

(60) Provisional application No. 60/246,113, filed on Nov. 7, 2000.

(51) Int. Cl.
*H01L 21/31* (2006.01)

(52) U.S. Cl. .................. 438/788; 438/743; 438/694; 438/784; 438/787

(58) Field of Classification Search ............ 438/758, 438/296, 427, 435, 478–479, 722–724, 737, 438/763, 743–744, 694–95, 776, 784, 787, 438/792; 156/345.43–345.46, 345.42–345.48; 118/723 E, 723 R, 723 I, 723 IR
See application file for complete search history.

(56) References Cited

U.S. PATENT DOCUMENTS

| | | | |
|---|---|---|---|
| 4,232,057 A | 11/1980 | Ray et al. | |
| 4,409,260 A | 10/1983 | Pastor et al. | |
| 4,474,829 A | 10/1984 | Peters | |
| 4,776,925 A | 10/1988 | Fossum et al. | |
| 4,918,031 A | 4/1990 | Flamm et al. | |
| 5,122,483 A | 6/1992 | Sakai et al. | |
| 5,234,529 A | 8/1993 | Johnson | |
| 5,405,492 A * | 4/1995 | Moslehi | 438/694 |
| 5,412,246 A | 5/1995 | Dobuzinsky et al. | |
| 5,738,909 A | 4/1998 | Thakur et al. | |
| 5,935,373 A * | 8/1999 | Koshimizu | 156/345.28 |
| 6,043,608 A * | 3/2000 | Samukawa et al. | 315/111.51 |
| 6,051,113 A * | 4/2000 | Moslehi | 204/192.12 |
| 6,051,503 A * | 4/2000 | Bhardwaj et al. | 438/705 |
| 6,101,972 A * | 8/2000 | Bluck et al. | 118/723 |
| 6,155,198 A * | 12/2000 | Danek et al. | 118/723 |
| 6,167,834 B1 * | 1/2001 | Wang et al. | 118/723 |
| 6,174,450 B1 * | 1/2001 | Patrick et al. | 216/61 |
| 6,187,682 B1 * | 2/2001 | Denning et al. | 438/694 |
| 6,187,685 B1 * | 2/2001 | Hopkins et al. | 438/710 |
| 6,200,651 B1 * | 3/2001 | Roche et al. | 427/571 |
| 6,256,434 B1 * | 7/2001 | Matuschek et al. | 385/37 |
| 6,258,735 B1 * | 7/2001 | Xia et al. | 438/788 |

(Continued)

*Primary Examiner*—Luan Thai
(74) *Attorney, Agent, or Firm*—Oblon, Spivak, McClelland, Maier & Neustadt, P.C.

(57) ABSTRACT

A method and system for forming a low defect oxide in a plasma processing chamber. By pulsing at least one of an RF power source and a processing gas, the growth of the oxide can be regulated. During periods in which the processing gas is not injected, an inert gas is injected to keep a substantially constant flow rate.

27 Claims, 9 Drawing Sheets

ILLUSTRATION OF PROCESS CHAMBER

CONTINUOUS 1st RF, PULSED 2nd RF
AND PULSED GAS DELIVERY MODE

U.S. PATENT DOCUMENTS

| | | | |
|---|---|---|---|
| 6,331,494 B1 * | 12/2001 | Olson et al. ................ 438/770 |
| 6,410,462 B1 | 6/2002 | Yang et al. |
| 6,413,583 B1 | 7/2002 | Moghadam et al. |
| 6,461,483 B1 * | 10/2002 | Gopalraja et al. ..... 204/192.12 |
| 6,475,353 B1 * | 11/2002 | Lantsman .............. 204/192.12 |
| 6,482,476 B1 * | 11/2002 | Liu ............................ 427/535 |
| 6,541,367 B1 * | 4/2003 | Mandal ...................... 438/622 |
| 6,562,715 B1 * | 5/2003 | Chen et al. ................. 438/643 |
| 6,709,715 B1 * | 3/2004 | Lang et al. ................. 427/489 |
| 2002/0132473 A1 * | 9/2002 | Chiang et al. .............. 438/643 |
| 2002/0171994 A1 * | 11/2002 | Grimard et al. ............ 361/234 |
| 2003/0049931 A1 * | 3/2003 | Byun et al. ................. 438/649 |

\* cited by examiner

ILLUSTRATION OF PROCESS CHAMBER

CONTINUOUS RF AND CONTINUOUS GAS DELIVERY MODE

CONTINUOUS 1st RF, PULSED 2nd RF
AND PULSED GAS DELIVERY MODE

PULSED 1st RF AND
PULSED GAS DELIVERY MODE

METHOD OF FABRICATING OXIDES WITH LOW DEFECT DENSITIES

CROSS-REFERENCE TO RELATED APPLICATIONS

The present application is the National Stage of International Application No. PCT/US01/42925, filed Nov. 7, 2001, which claims the benefit of U.S. Provisional Application No. 60/246,113 filed on Nov. 7, 2000. The present invention is related to U.S. application Ser. No. 10/088,504 filed Sep. 17, 2002 and U.S. application Ser. No. 10/204,448 filed Sep. 3, 2002. The contents of those applications are incorporated herein by reference in their entirety.

BACKGROUND OF THE INVENTION

1. Field of the Invention

The present invention is directed to a method and system for fabricating low defect-density oxides, and more particularly to a method and system for fabricating oxides using at least one of a pulsed RF energy source and a pulsed process gas source.

2. Discussion of the Background

Significant attention has been given to methods of forming the gate dielectric layer used in MOSFETs. Both oxidation of semiconductors and deposition of dielectric layers on the surface have heretofore been used. Thin silicon dioxide films have been formed by various methods such as thermal oxidation, low pressure chemical vapor deposition, photo-activated chemical vapor deposition, plasma enhanced chemical vapor deposition, and plasma oxidation. The most successful approach for gate oxide growth so far has been thermal oxidation of silicon at elevated temperatures (e.g., in excess of 900° C.). High temperature thermal oxidation of silicon provides a thin layer of low defect density silicon dioxide as well as a good silicon/oxide interface.

One critical property of the gate oxide layer, regardless of the way it is fabricated, is that it must have high dielectric strength, or in another words, very low defect density. Dielectric strength is directly, but inversely, related to the defect density inside the dielectric layer. Defects in the gate oxide can be formed because of numerous reasons (e.g., particulates, defects that originally resided at the silicon surface, surface contamination, and atoms arriving at the reaction front not having enough energy to move into full density location sites). Assuming the process starts with a perfect silicon surface and free of particulates and contaminants, the defect density of the resulting silicon dioxide is very much dependent upon the energies of the atoms arriving at the reaction surface. This is true for both oxidation and deposition processes.

As the ULSI technologies advance, the requirements for precise dopant distribution become extremely stringent. Processes requiring high temperature operation (e.g., at least 900° C.) for a substantial length of time (e.g., at least 5 minutes) may cause dopant re-distribution and, therefore, they should be minimized wherever possible. As a result, approaches that perform oxidation or annealing at temperatures lower than 800° C. or for a period of time shorter than a few minutes become very attractive.

Growing silicon dioxide with the assistance of a plasma discharge provides a method of fabricating silicon dioxide at temperatures as low as 300° C. Plasma assisted growth of oxides can be further classified as either: (1) plasma oxidation or (2) plasma enhanced chemical vapor deposition.

U.S. Pat. No. 4,232,057 (hereinafter "the '057 patent") describes a method of growing oxide films on silicon utilizing plasma oxidation. The process employs oxygen at a flow rate of 0.7–10 sccm utilizing a relatively high RF power. The substrate is held at a temperature between 300°–800° C. and about 20 cm away from the plasma source, as shown in FIG. 1. The oxidation rate was found to be dependent upon the RF power applied to the plasma source, as shown in FIG. 2. According to the method, the main oxidation species is oxygen radicals generated by the plasma discharge. The oxygen radicals diffuse into the silicon substrate and react with silicon to form an oxide on the surface. Although the oxygen radicals are chemically active, they carry very little energy. The mobility of the atoms on the silicon surface is therefore mainly controlled by the substrate temperature. As a result, the formed silicon oxide is more porous and defective. It is also known that the use of high RF power results in thicker oxide films with poor quality.

U.S. Pat. No. 5,412,246 describes a method for growing thin oxides as gate dielectric layers using plasma discharge and an ozone/oxygen gas mixture. The ozone is generated in an ozone generator separated from the RF plasma reactor. Using the stand-alone ozone generator eliminates the need for high RF power in the oxidation chamber that may result in poor oxide quality. The use of RF power is optional as ozone itself can provide chemically active oxygen species for oxidation. Low RF power is used to enhance the oxide growth rate and to improve film quality and thickness uniformity. The low power RF (<200 watt/cm) can reexcite or redistribute the ozone. A supplemental rapid thermal oxidation at temperatures of 700°–800° C. in the presence of ozone may be introduced after the plasma oxidation as a follow-up. The dielectric strength of the resulting oxide, as shown in FIG. 3, shows high film quality that is comparable to that obtained by high temperature thermal oxidation. Similar to the work described in the '057 patent, the oxidation of the silicon surface relies on the chemically active oxygen species and the mobility of the atoms on the surface which is only provided by the thermal heating of the substrate. The resulting oxide film may be more porous and may depend heavily on the initial surface condition.

U.S. Pat. No. 4,776,925 describes producing silicon oxide or nitride thin films using low energy ion beam bombardment. As shown in FIG. 4, the method directs an ion beam having an energy level around 60 eV to a silicon substrate at room temperature. The ion beam is formed by an ionized gas of oxygen or nitrogen, possibly diluted with argon, in a glow discharge. The ions are then extracted through a grid biased negatively with respect to the plasma. A similar approach to forming silicon oxide layers using oxygen ion beams is disclosed in U.S. Pat. No. 5,122,483. Disadvantageously, those energetic ion beams may result in high surface contamination because of the ion sputtering effect. The re-deposition of sputtered materials onto the substrate surface may also degrade the oxide quality. Furthermore, the throughput of oxidizing large diameter silicon wafers is very low using a single ion beam technique.

A similar concept of using atomic oxygen to react with a silicon surface at elevated temperatures without plasma discharge has also been studied. U.S. Pat. Nos. 4,474,829, 4,409,260, and 5,738,909 generally use either ozone or UV radiation excited oxygen or oxygen-containing precursors to create the atomic oxygen. A high substrate temperature or an RTP process is needed in order to obtain gate-quality oxide.

Plasma enhanced chemical vapor deposition has been used to fabricate relatively thick silicon dioxide or silicon nitride layers (e.g., often >1000 A), primarily because of its high deposition rate (>3000 A/minute) and low process temperature (<500° C.). The atoms or molecules arriving at the surface in a conventional PECVD system do not have enough energy and time to diffuse into a low energy position. Therefore, the dielectric films generated generally have a high defect density and a low electric breakdown field.

Plasma oxidation and plasma enhanced chemical vapor deposition have been used to produce silicon oxide as dielectric layers. As described above, these plasma enhanced processes have the advantage of fabricating silicon oxide at low temperatures (e.g., below 800° C.). However, gate-quality films of less than 100 A produced by plasma oxidation or PECVD have not been achieved without utilizing other supplemental processes such as rapid thermal oxidation. Although oxygen ion beams have been used to produce thin oxide films as gate dielectrics, the use of relatively high-energy ion beams has the disadvantages of low throughput, possible surface damage and sputtering contamination.

SUMMARY OF THE INVENTION

It is an object of the present invention to provide a method and system for fabricating low defect density oxides. Such oxides find use as, but are not limited to, gate dielectric materials in Metal-Oxide-Semiconductor Field Effect Transistors (MOSFETs) because the resulting thin films have high dielectric strengths that are conducive to good gate dielectric layers.

This object and other advantages of the present invention are addressed by a method and system for pulsing at least one of an RF power and a process gas flow rate during formation of those oxides.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
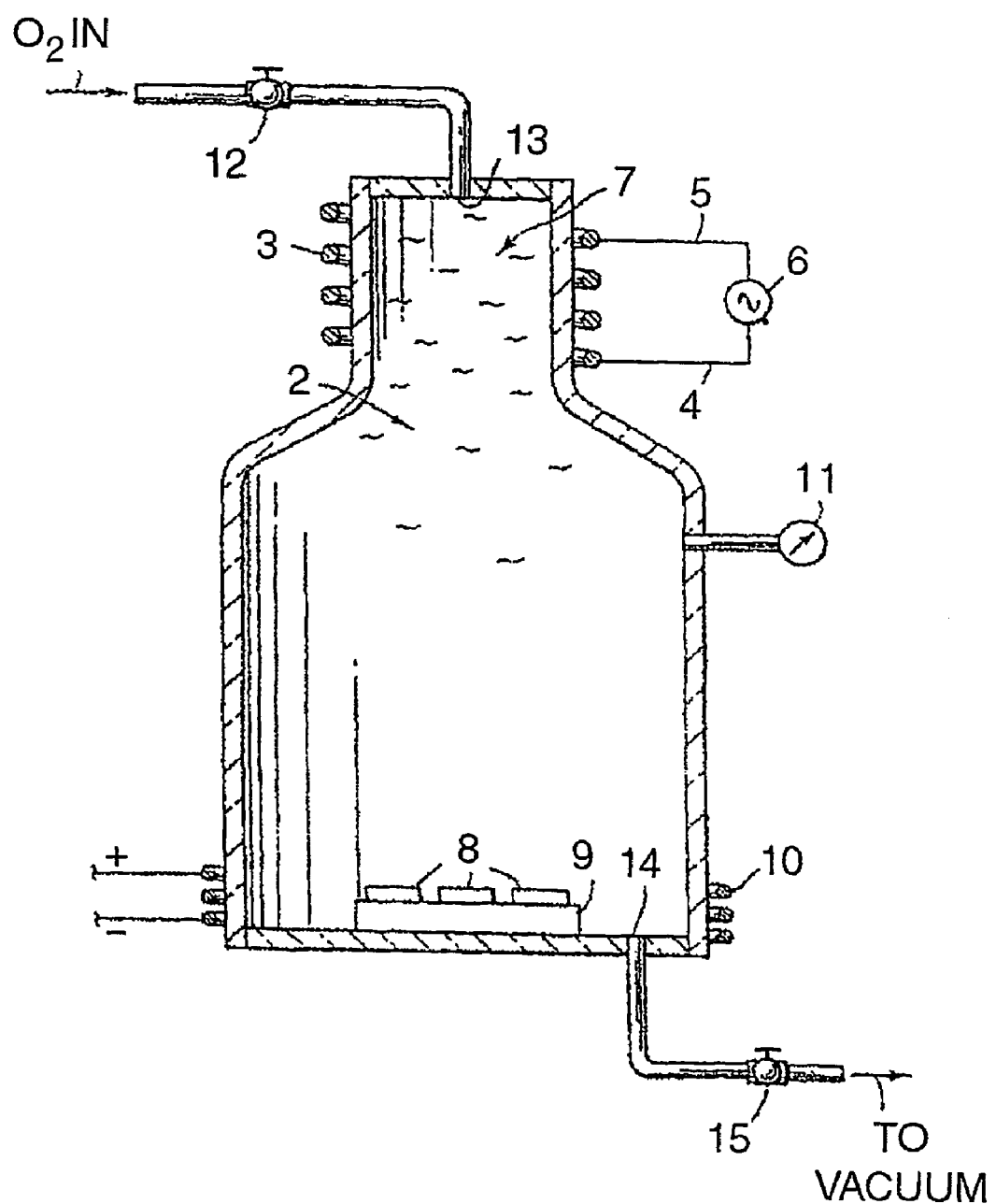
FIG. 1 illustrates a known plasma processing source.
Figure 2:
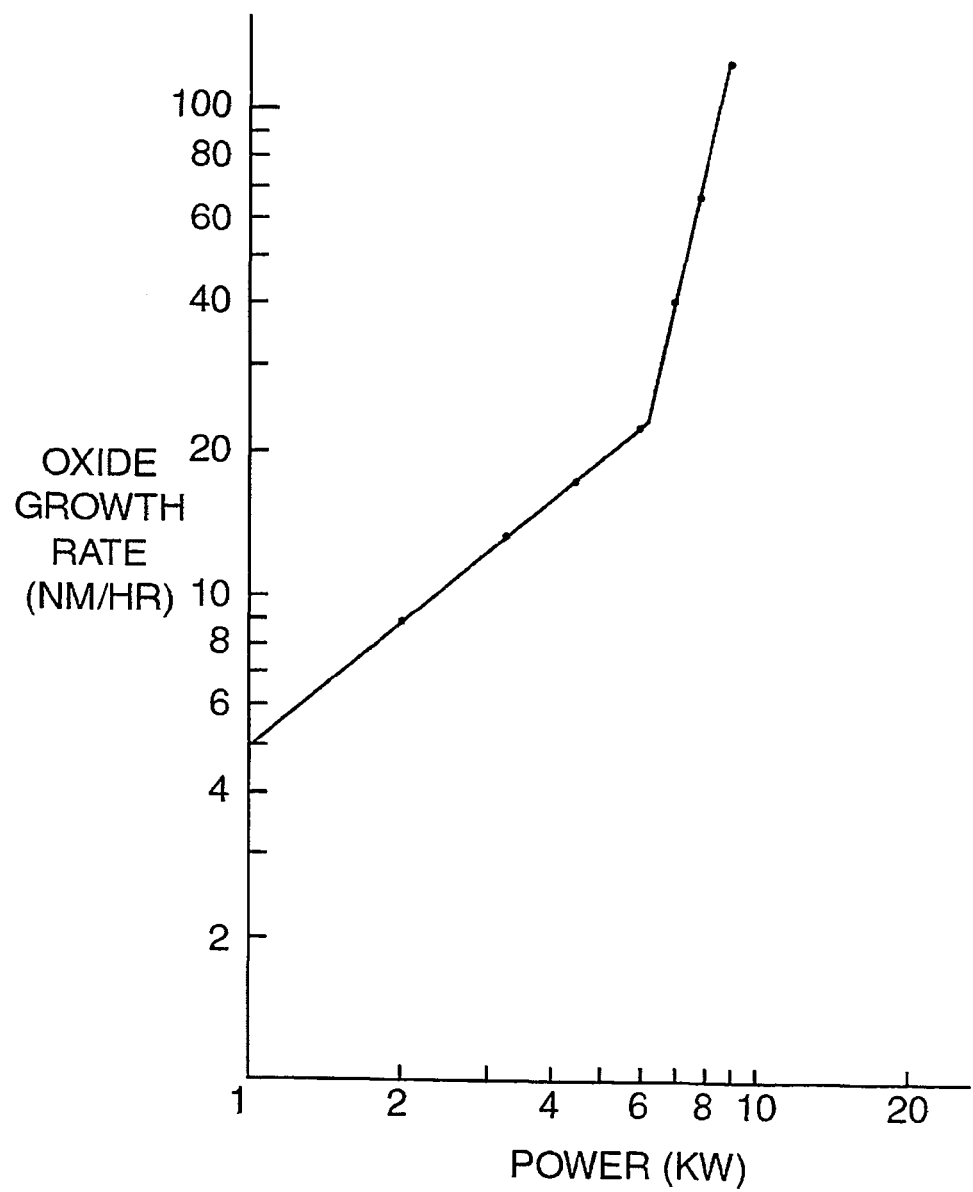
FIG. 2 is a graph of oxide rate versus power using the known method and system of FIG. 1.
Figure 3:
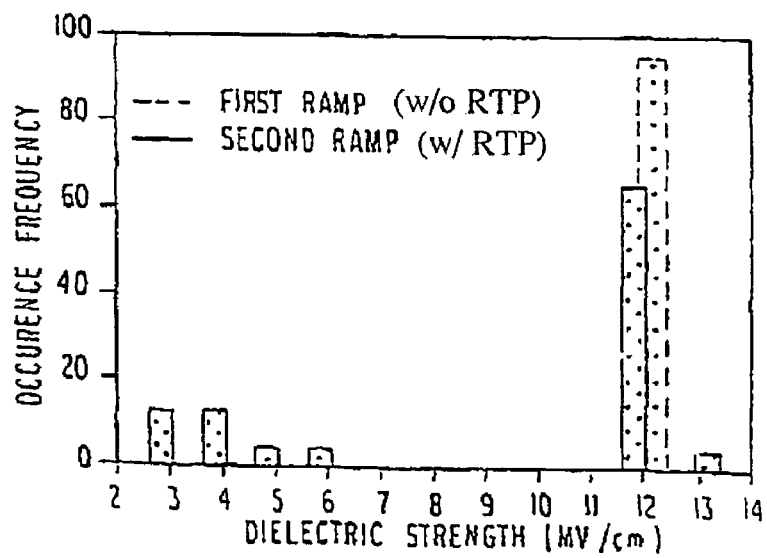
FIG. 3 is a graph of occurrence frequency using a known method.
Figure 4:
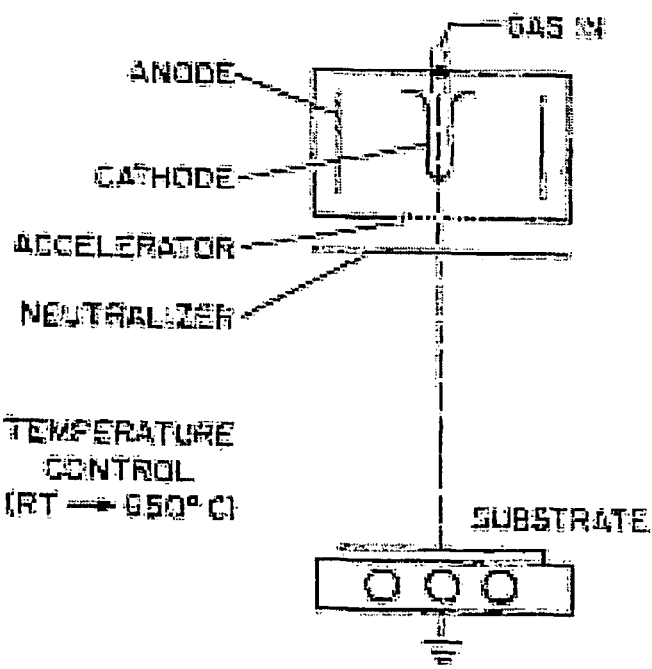
FIG. 4 is a known ion bombardment system for producing thin films.
Figure 5:
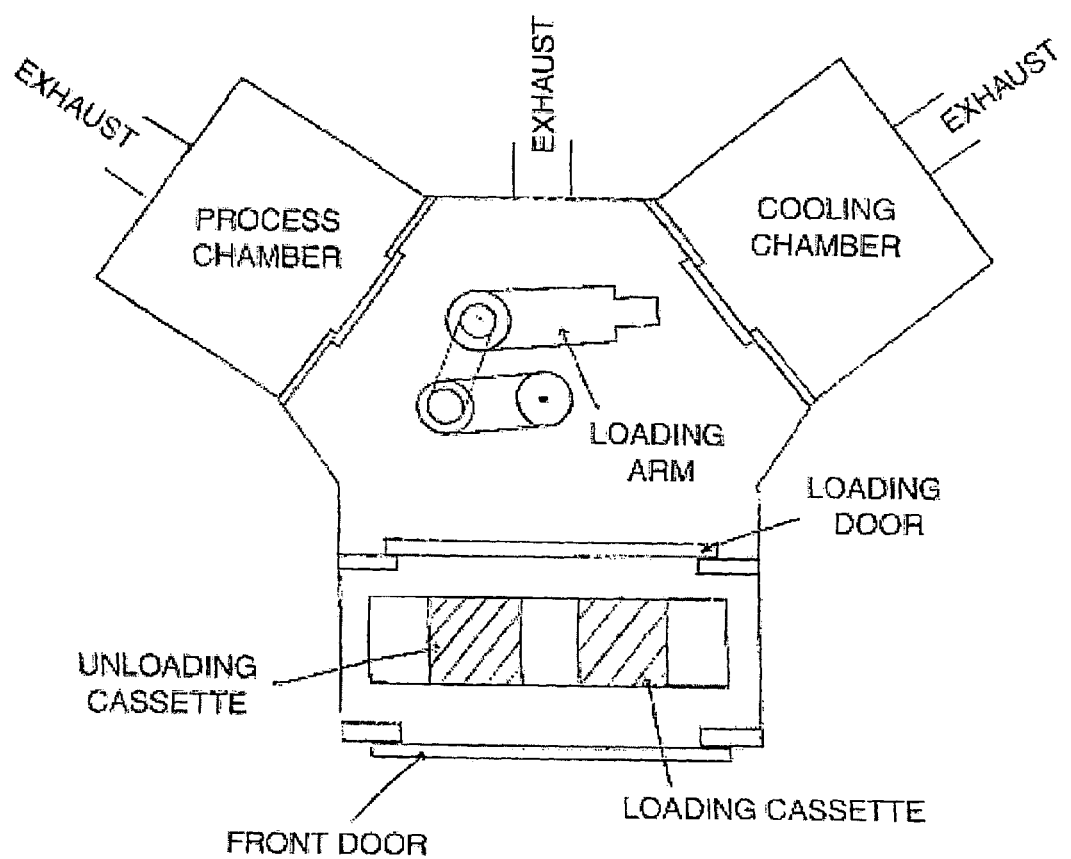
FIG. 5 is a multi-chamber plasma processing system for use in one aspect of the present invention.

Reference will now be made to the drawings, wherein like reference numerals designate identical or corresponding parts throughout the several views. FIG. 5 illustrates a multi-chamber processing system according to one aspect of the invention. The system includes a pair of loading/unloading cassettes, a load lock chamber, a processing chamber and a cooling chamber. A robotic arm located in the load lock chamber transfers the wafer from and to the cassettes and chambers during the processing cycles. Vacuum pumps are installed for each chamber in order to achieve the required vacuum conditions. Nitrogen gas lines are installed to the load lock and cooling chamber for purging and venting purposes. Gas lines for delivering gases or liquid vapors are installed to the process chamber. Heating or cooling mechanism can also be installed to the processing and cooling chambers.

Figure 6:
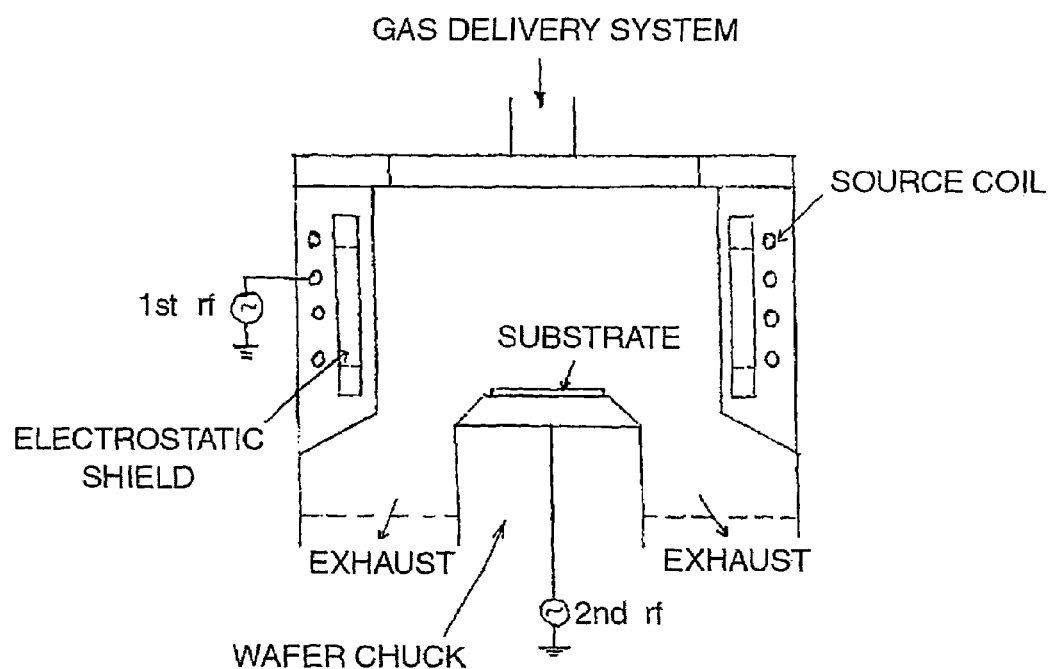
FIG. 6 is a cross-section of an exemplary plasma processing chamber according to the present invention.

One chamber for use in the system of FIG. 5 is a plasma processing chamber as illustrated in FIG. 6. The chamber preferably utilizes a low energy, high-density plasma source, such as the electrostatically shielded RF (ESRF) inductively coupled plasma source as described in U.S. Pat. Nos. 4,918,031 and 5,234,529. The plasma source produces the oxygen ions and atoms for the oxidation process or the ions/atoms of oxygen and silicon precursor for the chemical vapor deposition process.

Such source plasma generating apparatuses include a longitudinally split, metallic shield disposed within a helical coil and disposed around an internal plasma region. The plasma and coil are separated by an insulating wall. The metallic shield prevents a significant part of the electric field from being coupled to the plasma capacitively, while allowing the RF power coupled to the plasma inductively.

As it is not very effective to couple RF power to the plasma inductively, it is difficult to use purely inductive coupling to initiate plasmas in many cases. On the contrary, RF power can be very effectively coupled to the plasma capacitively. This makes the capacitive coupling useful in initiating plasmas. The disadvantage of capacitive coupling is that it generally causes large and uncontrollable plasma potentials. These high plasma potentials lead to sputtering of chamber walls and high-energy ions. Sputtering of the chamber wall results in contamination, and high-energy ion bombardment results in damage of the substrate surface.

The slits in the metallic shield are designed to optimize the relative percentage of capacitively and inductively coupled RF power. Its width, length and relative position to the coil are particularly important as it directly affects the plasma property and process performance. To avoid difficulty in initiating plasmas but at the same time keeping the plasma potential low, the total area of the slit should be above 0.2%, but less than 5% or tunable in-situ to minimize ions with excess energy.

Within such a chamber, the substrate is processed. When starting with a clean silicon surface, the fabrication of a low defect density thin oxide film can be realized through increasing the mobility of the atoms or molecules arriving at the surface so that they can move to a low energy (or full density) position. Increasingly surface mobility is generally achieved by a combination of three techniques: 1) increasing surface temperature; 2) ion bombardment; and 3) chemical vapor molecule aided mobility.

Figure 10:
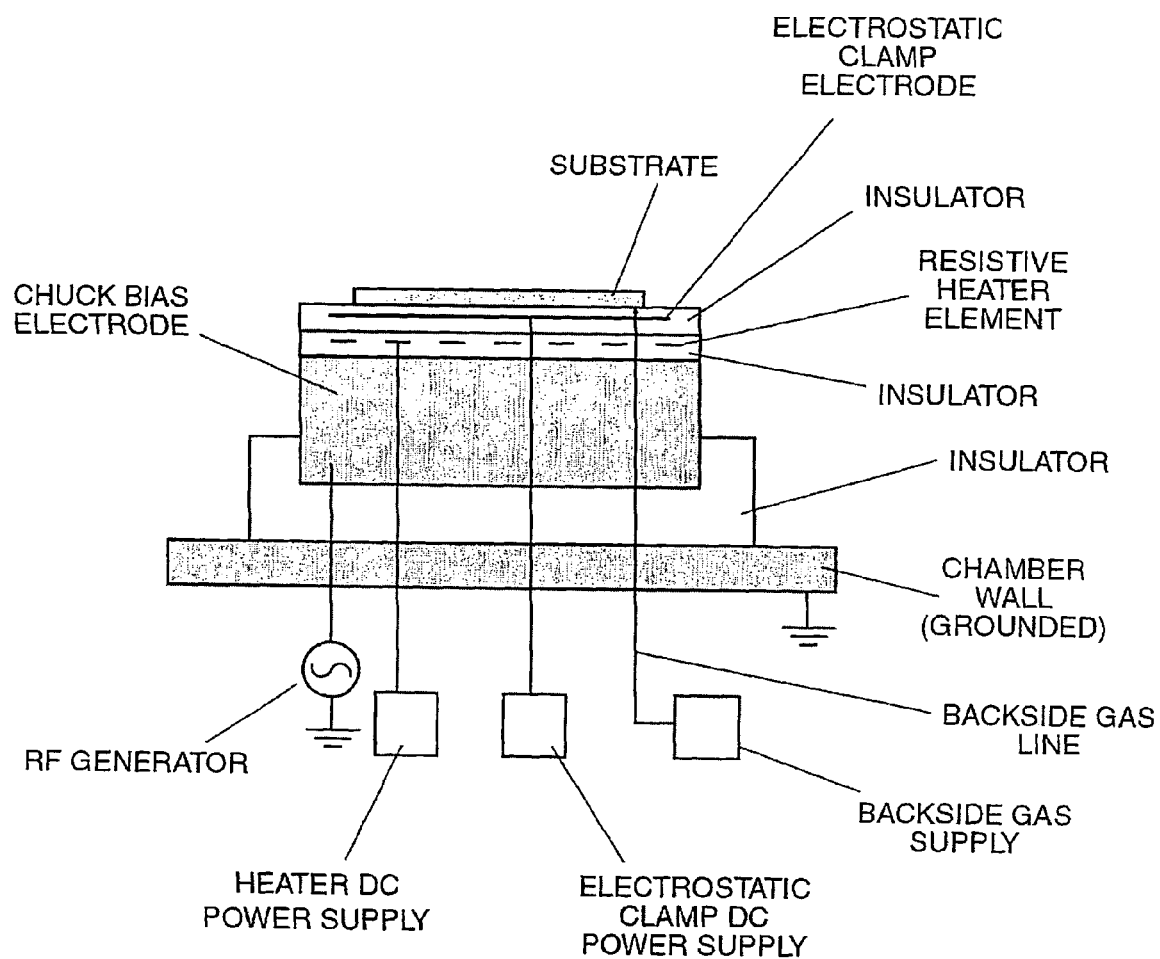
FIG. 10 presents a schematic representation of a chuck.

The substrate to be processed is heated to a temperature between 500°–800° C. An exemplary multi-zone resistance heater is described in PCT Application No. PCT/US00/25503, referenced above. The heater preferably utilizes fast heat delivery while maintaining a high uniformity (e.g., less than ±3° C.). Such a heater also uses a separate RF power supply to achieve a small level of negative bias on the substrate. The small bias level is used to provide the acceleration energy for the ion flux in order to achieve the surface temperature necessary for promoting the growth of the low defect density oxide film. The bias level on the wafer can be tuned through changing the RF power applied on the supporting chuck. A further example of such a chuck is illustrated in FIG. 10.

It is well known that increasing temperature can reduce the defect density of the thin oxide film. In conventional furnace oxidation, high quality silicon dioxide is grown at a substrate temperature between 1000°–1100° C. In order to grow the same or better quality silicon oxide film at a much lower substrate temperature (e.g., 500°–800° C.), the surface temperature where the oxidation or deposition process takes place should be increased through methods other than substrate heating. One method to increase the effective surface temperature is to bombard the surface with energetic particles such as ions from the plasma. As some of the deposition or reaction species coming from the plasma are ions, those ions can effectively provide the energy required for the reaction and the movement of the atoms/molecules.

An estimation of the correlation between surface atom/molecule temperature rise and plasma flux is provided in Table 1. A simple approximation is that the surface temperature is about 200° C. higher for every 1 eV (electron volt) per adatom. Table 1 summarizes a calculation, for silicon deposition, of apparent surface temperatures for given plasma density, bias voltage and deposition rate.

larly, the surface atom/molecule temperature can reach much higher than 1610° C. in the case of $SiO_2$ growth. This phenomenon enables the material growth to be carried out very differently than in a conventional thermal growth process for which the growth temperature is much lower (e.g., 900°–1100° C.). The achieved high surface temperature enables the arriving atoms/molecules to react and move quickly to a low energy location, minimizing defect density in the growing film. Thus, by controlling the source plasma one can control the reaction rate or deposition rate.

A gas injection system can be used to inject the gas mixture into the deposition chamber. A pumping system is used to keep the reaction chamber under vacuum and achieve low gas residence time inside the chamber (e.g., less than 1 millisecond). The residence time for the processing region is generally estimated from the ratio of the processing region volume (Liters) to the pumping speed (Liters/sec) at the processing region. Therefore, it is preferable to to minimize the processing region volume and maximize the pumping speed at the processing region to achieve a low residence time. For instance, a vacuum system equipped with a 3300 l/sec turbo-molecular pump (e.g. Mitsubishi FT3300W) can be designed with sufficient flow conductance (i.e. 10,300 L/sec) to permit the delivery of 75% of the pump inlet pumping speed to the processing region. Hence, for a cylindrical processing region of diameter 25.4 cm and height

TABLE 1

Apparent surface temperature for given plasma density, bias voltage and deposition rate.

| Item | Unit | Value | Value | Value | Value |
|---|---|---|---|---|---|
| Ion Energy Equivalent | C/ev*adatom | 200 | 200 | 200 | 200 |
| Si Density | $gm/cm^3$ | 2.33 | 2.33 | 2.33 | 2.33 |
| Molecule Weight | | 28 | 28 | 28 | 28 |
| Molar Density | $atoms/cm^3$ | $5 \times 10^{22}$ | $5 \times 10^{22}$ | $5 \times 10^{22}$ | $5 \times 10^{22}$ |
| Molar Density | $atoms/cm^2 \mu m$ | $5 \times 10^{18}$ | $5 \times 10^{18}$ | $5 \times 10^{18}$ | $5 \times 10^{18}$ |
| Bias Voltage | volt | 10 | 10 | 10 | 10 |
| Plasma Density | $/cm^3$ | $1.4 \times 10^{10}$ | $1.4 \times 10^{11}$ | $1.4 \times 10^{12}$ | $1.4 \times 10^{12}$ |
| Plasma Flux | $amp/cm^2$ | 0.0003 | 0.003 | 0.03 | 0.03 |
| Ion Flux | $Ion/cm^2$*sec | $1.875 \times 10^{15}$ | $1.875 \times 10^{16}$ | $1.875 \times 10^{17}$ | $1.875 \times 10^{17}$ |
| Plasma Flux | $watt/cm^2$ | 0.003 | 0.03 | 0.3 | 0.3 |
| Plasma Flux | $eV/cm^2$*sec | $1.875 \times 10^{16}$ | $1.875 \times 10^{17}$ | $1.875 \times 10^{18}$ | $1.875 \times 10^{18}$ |
| Deposition Rate | $\mu m/min$ | 0.5 | 1 | 5 | 3 |
| Atomic Flux | $atoms/cm^2$*sec | $4.167 \times 10^{16}$ | $8.33 \times 10^{16}$ | $4.167 \times 10^{17}$ | $2.5 \times 10^{17}$ |
| Ion Flux | % | 4.5 | 22.5 | 45 | 75 |
| Bias Energy | eV/adatom | 0.45 | 2.25 | 4.5 | 7.5 |
| Apparent Temperature | C. | 90 | 450 | 900 | 1500 |

The apparent surface temperature increases dramatically with either ion energy or ion density or both. When the plasma density is about $1.4 \times 10^{10}/cm^3$ and deposition rate is about 0.5 μm/min (which is close to the condition of a conventional PECVD system), the energy of the arriving ions only gives 90° C. increase in surface temperature. To produce sufficient surface temperature, the arriving species should carry high-energy flux. High-energy ion flux can be realized by either high ion energy or high ion flux or both. As high energy ions may result in surface damage due to strong sputtering effect, plasma sources having high density but low ion energy, such as the referenced ESRF source, are preferred. With a plasma source density of $1.4 \times 10^{12}$ and a deposition rate of 3 μm/min, the increase of surface temperature is 1500° C. If the deposition rate is lower, the surface temperature could be even higher.

At high plasma density the surface atom/molecule can reach an equivalent temperature of much higher than the melting point of the material being grown. More particu- 5 cm, a residence time of approximately 1 msec can be achieved. Such a gas injection and pumping system help to achieve the process conditions required for low defect-density film deposition. In the case of plasma enhanced chemical vapor deposition, chemical molecules containing silicon are required as precursors. The gas molecules of silicon-containing precursor arriving at the substrate surface should be only partially dissociated and able to diffuse and react with oxygen atoms/ions to form silicon dioxide at a low energy position.

To grow a layer of thin silicon dioxide, a silicon wafer is first cleaned in a series of chemical solutions such as $NH_3OH/H_2O_2/H_2O$, $HCl/H_2O_2/H_2O$, $H_2SO_4/H_2O_2/H_2O$ to remove metallic as well as organic contamination that may exist on the wafer surface. A short dip in a $HF/H_2O$ solution is also performed to remove the surface native oxide layer. The wafer is then transferred into a load-lock chamber as shown in FIG. 5. (During the transportation of the wafer, both the load-lock and the processing chamber are being purged with inert gases (e.g., nitrogen).) The loadlock is then pumped down to a base pressure in the range of 0–2 mtorr, and then the chamber is pumped to maintain the pressure at 200–500 mtorr. This practice helps to reduce the residual moisture and oxygen content inside the chamber. The substrate chuck inside the process chamber is normally maintained at a idle temperature of 300°–400° C. The wafer is subsequently transferred into the processing chamber by a robotic arm. After the wafer is placed on the chuck, the chamber pumped down to a base pressure of 0–2 mtorr. The pressure inside the chamber is then maintained at the process pressure (e.g., 100 mtorr to 10 torr).

The wafer is heated to a processing temperature of 500°–800° C. and then processed. After the oxidation or deposition process is completed, the wafer is transferred out to a cooling chamber to cool down before returning to the unloading cassette.

The gases used in the oxidation process can be one of the following; (i) pure oxygen, (ii) a mixture of oxygen and inert gases, (iii) a mixture of oxygen and ozone, (iv) a mixture of oxygen, ozone and inert gases, and (v) other oxygen-containing gases. The gases used in the deposition process can be a mixture of oxygen-containing gases such as $O_2$, NO, or $N_2O$, etc., and a silicon-containing precursor such as $SiCl_4$, or $SiCl_2H_2$, or TEOS (tetraethylorthosilicate), etc. Inert gases may also be added in the deposition gas mixture.

Turning now to the actual processing of the substrate within the chamber, after stabilization of the process gas flow and pressure, the chuck is then heated rapidly to a temperature of 500°–800° C. and RF power is applied. When RF is applied to the source plasma, the oxide growth rate will be a function of the magnitude (and duty cycle in pulsed mode). Accurate oxide thickness control, which is extremely critical for gate dielectric application, can be realized using this phenomenon. Given a fixed magnitude, the oxide thickness can be controlled by the pulse duty cycle and the total number of pulses applied. The same mechanism can be applied with pulsed process gas delivery.

Figure 7:
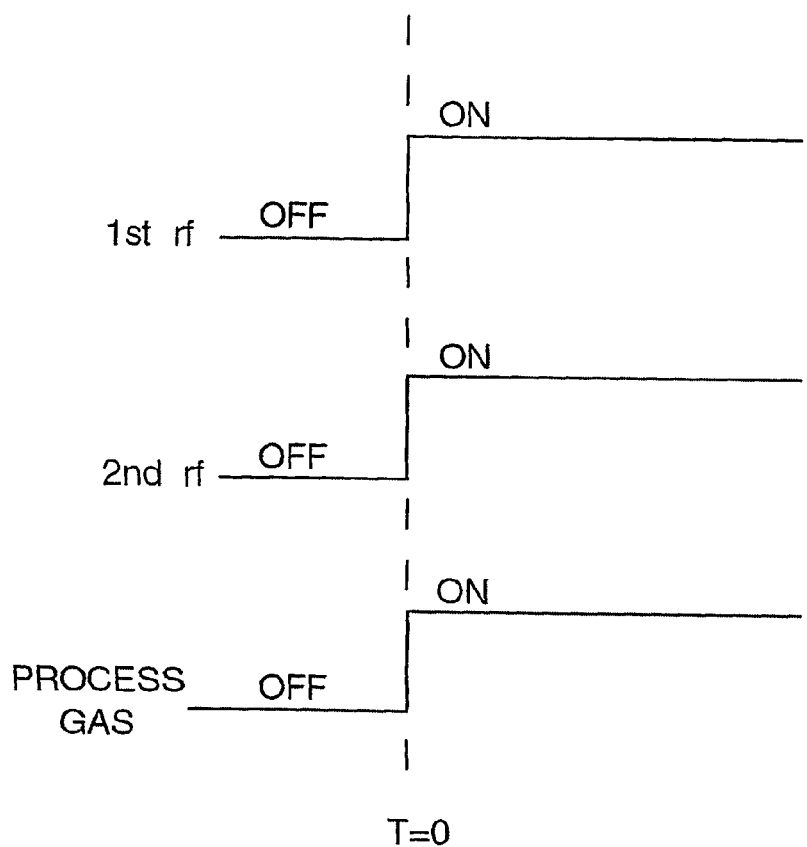
FIG. 7 is a series of graphs showing the RF powers and process gas flow rate according to a first embodiment of the present invention.

According to a first embodiment illustrated in FIG. 7, both the $1^{st}$ and $2^{nd}$ RF powers and the gas delivery are operated using continuous mode. Generally, the oxidation or deposition process starts once the RF and the gas flow are turned on, and the oxide film thickness is controlled primarily by time.

The first source of RF power is applied on the coil to generate the source plasma having a density in the range of $1 \times 10^{12}$–$5 \times 10^{13}$ ions/$cm^3$. The second source of RF power is simultaneously applied to the substrate chuck to provide a small level (e.g., −5 volts−−50 volts) of negative self-bias on the wafer. As a very thin layer (10–30 Angstroms) of lower quality native oxide may grow during the initial gas flow and pressure stabilization step, a short step (e.g., 5–20 seconds) with a slightly higher level of chuck RF power should be used to achieve a negative self-bias level of between −15 volts and −50 volts. This slightly higher level of bias produces higher energy ions that can effectively sputter away the thin native oxide. However, careful process optimization is necessary to avoid any excess sputtering of the silicon surface. The power of the $2^{nd}$ RF is lowered after the initial sputtering step to maintain a negative bias level of between −5 volts and −15 volts. This low bias level will provide the necessary energy (temperature) for the surface atoms/molecules while preventing the surface from sputtering damage.

Figure 8:
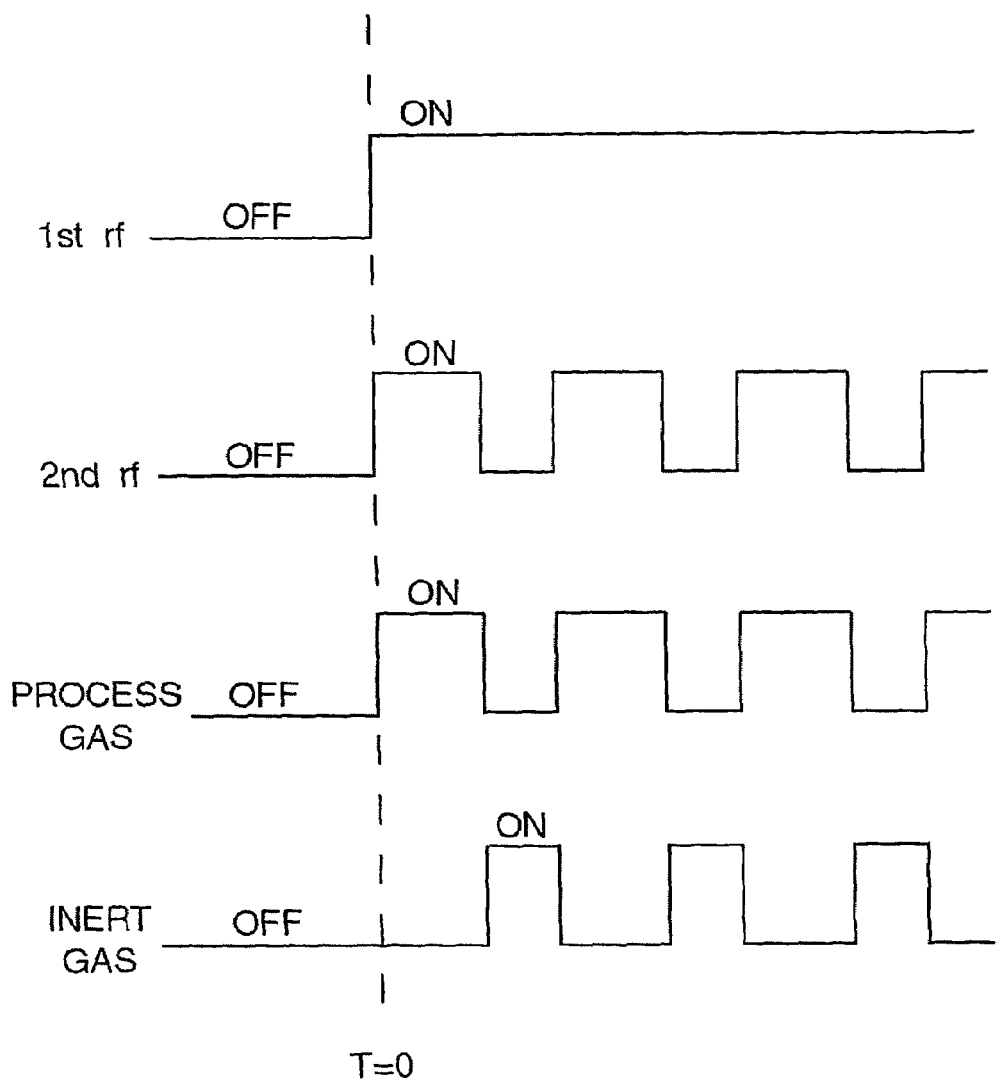
FIG. 8 is a series of graphs showing the RF powers and gas flow rates according to a second embodiment of the present invention.

An alternate embodiment, shown in FIG. 8, utilizes pulsed RF power. Although the $1^{st}$ RF source is operated in continuous mode, the $2^{nd}$ RF source and the gas flows are operated in pulsed mode of various duty cycles. For example, the duty cycle can be 50%. The $2^{nd}$ RF source is designed to be set on or off at substantially the same time as the process gas(es) is/are introduced. When the process gas flow is stopped, inert gases such as nitrogen or argon can be introduced to keep the chamber at operating pressure. In an alternate embodiment, there can be a time lag between the pulsing of the second RF source and the pulsing of the gas flows.

As the $1^{st}$ RF source is operated in continuous mode, the plasma will stay on throughout process. The oxidation or deposition starts and stops following the cycling of the process gas flow. There is no film growth during the off cycle of the process gases where only inert gases are introduced into the chamber. A fast pumping system prevents the gas transition (from process to inert or vice versa) from affecting the film growth. The $2^{nd}$ RF source (coupled to the chuck) is turned off during the process gas off cycle to minimize the inert gas ions from bombarding the grown film. In this mode, the thickness of the oxide is related to the number of cycles applied. An exemplary apparatus for pulsed gas and pulsed RF processing, including the gas injection design and the RF system design, is described in the International application PCT/US00/21667 entitled "Pulsed plasma processing method and apparatus", and it is, therefore, incorporated herein by reference in its entirety.

Figure 9:
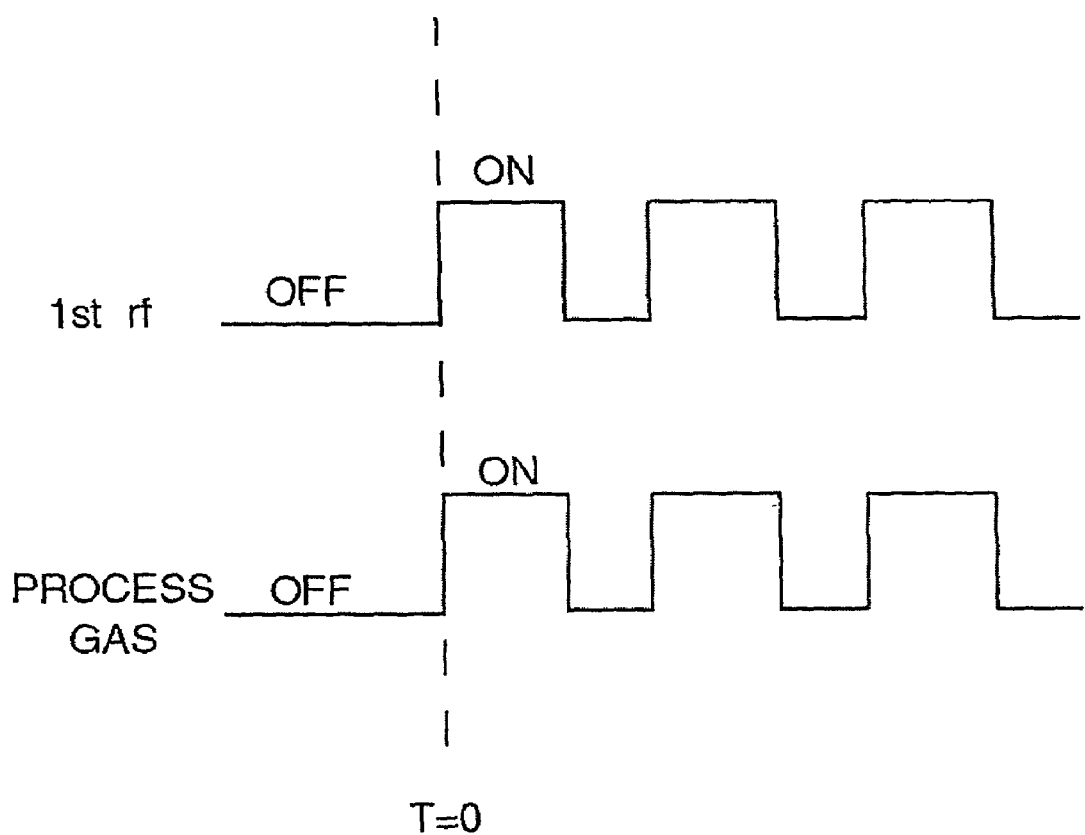
FIG. 9 is a series of graphs showing the RF power and process gas flow rate according to a third embodiment of the present invention.

In yet another alternate embodiment shown in FIG. 9, the $1^{st}$ RF and the gas flow are operated in pulsed mode. The $2^{nd}$ RF can be operated in either continuous or pulsed mode. The $1^{st}$ RF source is cycled with the process flow. When the process gas flow is stopped, either no gas or inert gases such as nitrogen or argon can be introduced to the chamber. To be successful in this mode of operation, the on and off cycle of the $1^{st}$ RF pulse needs to be long enough (e.g., >100 milliseconds) to minimize the impact of plasma rise and decay following $1^{st}$ RF on-set and off-set. The chamber can be evacuated to the base pressure during the RF off cycle as no plasma is necessary. In this mode, the thickness of the oxide is related to the number of cycles applied.

Obviously, numerous modifications and variations of the present invention are possible in light of the above teachings. It is therefore to be understood that, within the scope of the appended claims, the invention may be practiced otherwise than as specifically described herein.

The invention claimed is:

1. A method of forming an oxide layer on a substrate in a plasma processing chamber using a first RF source for coupling energy to a plasma and a second RF source for biasing the substrate, the method comprising the steps of:
   injecting into the plasma processing chamber a process gas for growing an oxide layer;
   applying a continuous power from the first RF source;
   pulsing the second RF power source and
   heating the substrate within the plasma processing chamber substantially simultaneously with at least one of said step of applying and said step of pulsing,
   wherein said step of applying and said step of pulsing occur substantially, simultaneously.

2. The method according to claim 1, wherein the pulses of the second RF power source comprise a duty cycle ranging from 10% to 90%.

3. The method according to claim 2, wherein the pulses of the second RF power source comprise a 50% duty cycle.

4. The method according to claim 3, the method further comprising a step of:
   pulsing a processing gas substantially in synchronization with the duty cycle of the second RF power source.

5. The method according to claim 4, the method further comprising a step of:
pulsing an inert gas substantially in synchronization with an inverse of the duty cycle of the second RF power source.

6. The method according to claim 4, wherein the processing gas comprises at least one of pure oxygen, a mixture of oxygen and inert gases, a mixture of oxygen and ozone, a mixture of oxygen, ozone and inert gases, and other oxygen-containing gases.

7. The method according to claim 4, the method further comprising a step of:
purging the plasma processing chamber prior to at least one of said step of applying and said step of pulsing.

8. The method according to claim 1, the method further comprising a step of:
heating the substrate within the plasma processing chamber prior to at least one of said step of applying and said step of pulsing.

9. The method according to claim 1, wherein the second RF source is set on substantially at the same time the process gas is introduced.

10. A method of forming an oxide layer on a substrate in a plasma processing chamber using a first RF source for coupling energy to a plasma and a second RF source for biasing the substrate, the method comprising the steps of:
injecting into the plasma processing chamber a process gas for growing an oxide layer;
pulsing the first RF source using a first duty cycle; and
pulsing a processing gas substantially in synchronization with the first duty cycle.

11. The method according to claim 10, wherein the pulses of the first RF power source comprise a duty cycle of 10% to 90%.

12. The method according to claim 10, wherein the pulses of the first RF power source comprise a 50% duty cycle.

13. The method according to claim 11, the method further comprising a step of:
pulsing an inert gas substantially in synchronization with a second duty cycle, wherein the first and second duty cycles are substantially inversed.

14. The method according to claim 10, wherein the processing gas comprises at least one of pure oxygen, a mixture of oxygen and inert gases, a mixture of oxygen and ozone, a mixture of oxygen, ozone and inert gases, and other oxygen-containing gases.

15. The method according to claim 10, the method further comprising a step of:
purging the plasma processing chamber prior to at least one of said step of pulsing the first RF source and said step of pulsing the processing gas.

16. The method according to claim 10, the method further comprising a step of:
heating the substrate within the plasma processing chamber prior to at least one of said step of pulsing the first RF source and said step of pulsing the processing gas.

17. The method according to claim 10, the method further comprising a step of:
heating the substrate within the plasma processing chamber substantially simultaneously with at least one of said step of pulsing the first RF source and said step of pulsing the processing gas.

18. A method of forming an oxide layer on a substrate in a plasma processing chamber using a first RF source for coupling energy to a plasma and a second RF source for biasing the substrate, the method comprising the steps of:
applying a continuous power from the first RF source;
pulsing the second RF power source; and
pulsing an inert gas substantially in synchronization with an inverse of a duty cycle of the second RF power source.

19. The method according to claim 18, the method further comprising a step of:
pulsing a processing gas substantially in synchronization with the duty cycle of the second RF power source.

20. The method according claim 19, wherein the processing gas comprises at least one of pure oxygen, a mixture of oxygen and inert gases, a mixture of oxygen and ozone, a mixture of oxygen, ozone and inert gases, and other oxygen-containing gases.

21. The method according to claim 18, the method further comprising a step of:
purging the plasma processing chamber prior to at least one of said step of applying, said step of pulsing the second RF source and said step of pulsing an inert gas.

22. The method according to claim 18, the method further comprising a step of:
heating the substrate within the plasma processing chamber prior to at least one of said step of applying, said step of pulsing the second RF source and said step of pulsing an inert gas.

23. A method of forming an oxide layer on a substrate in a plasma processing chamber using a first RF source for coupling energy to a plasma and a second RF source for biasing the substrate, the method comprising the steps of:
pulsing the first RF source using a first duty cycle;
pulsing a processing gas substantially in synchronization with the first duty cycle; and
pulsing an inert gas substantially in synchronization with a second duty cycle, wherein the first and second duty cycles are substantially inversed.

24. The method according to claim 23, wherein the processing gas comprises at least one of pure oxygen, a mixture of oxygen and inert gases, a mixture of oxygen and ozone, a mixture of oxygen, ozone and inert gases, and other oxygen-containing gases.

25. The method according to claim 23, the method further comprising a step of:
purging the plasma processing chamber prior to at least one of said step of pulsing the first RF source, said step of pulsing the processing gas, and said step of pulsing an inert gas.

26. The method according to claim 23, the method further comprising a step of:
heating the substrate within the plasma processing chamber prior to at least one of said step of pulsing the first RF source, said step of pulsing the processing gas, and said step of pulsing an inert gas.

27. The method according to claim 23, the method further comprising a step of:
heating the substrate within the plasma processing chamber substantially simultaneously with at least one of said step of pulsing the first RF source, said step of pulsing the processing gas, and said step of pulsing an inert gas.

* * * * *